(12) United States Patent
Sato et al.

(10) Patent No.: US 10,714,663 B2
(45) Date of Patent: Jul. 14, 2020

(54) METHOD OF MANUFACTURING LIGHT EMITTING DEVICE

(71) Applicant: NICHIA CORPORATION, Anan-shi (JP)

(72) Inventors: Daisuke Sato, Anan (JP); Atsushi Hashizume, Anan (JP); Toshiki Nishihama, Anan (JP); Shimpei Maeda, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 208 days.

(21) Appl. No.: 15/909,877

(22) Filed: Mar. 1, 2018

(65) Prior Publication Data

US 2018/0198038 A1   Jul. 12, 2018

Related U.S. Application Data

(62) Division of application No. 15/403,179, filed on Jan. 11, 2017, now Pat. No. 9,947,841, which is a division
(Continued)

(30) Foreign Application Priority Data

Sep. 30, 2014 (JP) .................................. 2014-202194

(51) Int. Cl.
*H01L 33/50* (2010.01)
*H01L 33/60* (2010.01)
(Continued)

(52) U.S. Cl.
CPC .......... *H01L 33/505* (2013.01); *H01L 25/167* (2013.01); *H01L 33/504* (2013.01);
(Continued)

(58) Field of Classification Search
CPC ... H01L 25/167; H01L 33/504; H01L 33/505; H01L 33/508; H01L 33/52; H01L 33/58;
(Continued)

(56) References Cited

U.S. PATENT DOCUMENTS 4,785,338 A   11/1988   Kinoshita et al.
6,809,342 B2  10/2004   Harada
(Continued)

FOREIGN PATENT DOCUMENTS

EP    2479812      7/2012
JP    2007-324608  12/2007
(Continued)

OTHER PUBLICATIONS

Ex Parte Quayle Action with Form PTO-892 Notice of References Cited issued by the U.S. Patent and Trademark Office for U.S. Appl. No. 14/870,009, Jun. 24, 2016.
(Continued)

*Primary Examiner* — Mary A Wilczewski
(74) *Attorney, Agent, or Firm* — Mori & Ward, LLP

(57) ABSTRACT

A method of manufacturing a light emitting device, includes providing a light emitting element having an element upper surface, an element lower surface opposite to the element upper surface in a thickness direction of the light emitting element, and an element side surface between the element upper surface and the element lower surface. A wavelength converter having a converter lower surface is provided. The wavelength converter is joined to the light emitting element using an adhesive so that the converter lower surface faces the element upper surface. The converter lower surface has an exposed region that does not face the element upper surface viewed along the thickness direction. The adhesive covers the element side surface and the exposed region.

14 Claims, 6 Drawing Sheets

Related U.S. Application Data of application No. 14/870,009, filed on Sep. 30, 2015, now Pat. No. 9,577,161.

(51) Int. Cl.
  *H01L 33/58* (2010.01)
  *H01L 25/16* (2006.01)
  *H01L 33/52* (2010.01)

(52) U.S. Cl.
  CPC ............ *H01L 33/508* (2013.01); *H01L 33/58* (2013.01); *H01L 33/60* (2013.01); *H01L 33/52* (2013.01); *H01L 2224/16225* (2013.01); *H01L 2224/73253* (2013.01); *H01L 2924/0002* (2013.01); *H01L 2924/10155* (2013.01); *H01L 2924/181* (2013.01); *H01L 2933/0041* (2013.01); *H01L 2933/0058* (2013.01)

(58) Field of Classification Search
  CPC ............ H01L 33/60; H01L 2933/0041; H01L 2933/0058
  See application file for complete search history.

(56) References Cited

U.S. PATENT DOCUMENTS

| | | | |
|---|---|---|---|
| 8,096,668 B2 | 1/2012 | Abu-Ageel | |
| 8,297,783 B2 | 10/2012 | Kim | |
| 8,545,033 B2 | 10/2013 | Gielen et al. | |
| 8,628,368 B2 | 1/2014 | Kim | |
| 8,669,575 B2 | 3/2014 | Daicho et al. | |
| 8,704,262 B2 | 4/2014 | Livesay et al. | |
| 8,860,053 B2 | 10/2014 | Mizuno | |
| 8,860,061 B2 | 10/2014 | Kotani | |
| 8,896,001 B2 | 11/2014 | Inoue et al. | |
| 8,928,021 B1 | 1/2015 | Bibl et al. | |
| 8,957,428 B2* | 2/2015 | Jagt | H01L 33/44 257/88 |
| 9,035,339 B2 | 5/2015 | Yamamuro | |
| 9,111,464 B2 | 8/2015 | Bibl et al. | |
| 9,224,925 B2 | 12/2015 | Mochizuki | |
| 9,349,924 B2 | 5/2016 | Hoelen et al. | |
| 9,377,167 B2 | 6/2016 | Gielen et al. | |
| 9,385,258 B2* | 7/2016 | Schlereth | H01L 31/02325 |
| 9,537,060 B2 | 1/2017 | Yoon et al. | |
| 9,557,034 B2 | 1/2017 | Woodgate et al. | |
| 9,577,161 B2* | 2/2017 | Sato | H01L 25/167 |
| 9,599,857 B2 | 3/2017 | Bibl et al. | |
| 9,947,841 B2* | 4/2018 | Sato | H01L 25/167 |
| 10,193,036 B2* | 1/2019 | Beppu | H01L 21/3213 |
| 10,230,030 B2* | 3/2019 | Chen | H01L 33/486 |
| 2002/0021786 A1 | 2/2002 | Hamamoto et al. | |
| 2005/0093007 A1 | 5/2005 | Steigerwald et al. | |
| 2005/0269582 A1* | 12/2005 | Mueller | C04B 35/44 257/94 |
| 2006/0258028 A1 | 11/2006 | Paolini et al. | |
| 2009/0244882 A1* | 10/2009 | Samber | H01L 33/60 362/84 |
| 2010/0328925 A1 | 12/2010 | Hoelen et al. | |
| 2010/0328926 A1 | 12/2010 | Hoelen et al. | |
| 2011/0175117 A1* | 7/2011 | Jagt | H01L 33/44 257/88 |
| 2011/0284902 A1 | 11/2011 | Daicho et al. | |
| 2012/0305970 A1 | 12/2012 | Kim | |
| 2013/0127331 A1 | 5/2013 | Tsutsumi et al. | |
| 2013/0200417 A1* | 8/2013 | Preuss | H01L 33/505 257/98 |
| 2013/0200784 A1 | 8/2013 | Matsuura et al. | |
| 2014/0008683 A1* | 1/2014 | Petersen | H01L 33/50 257/98 |
| 2014/0131753 A1 | 5/2014 | Ishida et al. | |
| 2014/0203306 A1* | 7/2014 | Ito | H01L 33/505 257/88 |
| 2014/0339495 A1 | 11/2014 | Bibl et al. | |
| 2015/0001563 A1 | 1/2015 | Miki | |
| 2015/0060917 A1 | 3/2015 | Vampola et al. | |
| 2015/0060930 A1 | 3/2015 | Sasaki et al. | |
| 2015/0062907 A1 | 3/2015 | Ng et al. | |
| 2015/0188004 A1* | 7/2015 | Ozeki | H01L 33/507 257/98 |
| 2015/0263241 A1* | 9/2015 | Akiyama | H01L 33/44 257/98 |
| 2015/0340575 A1* | 11/2015 | Nakabayashi | H01L 33/642 257/91 |
| 2016/0013371 A1 | 1/2016 | Han et al. | |
| 2016/0093781 A1* | 3/2016 | Tamaki | H01L 33/505 257/98 |
| 2017/0033267 A1* | 2/2017 | Tamaki | H01L 33/502 |
| 2017/0248281 A1* | 8/2017 | Ozeki | F21K 9/66 |
| 2018/0123001 A1* | 5/2018 | Hung | H01L 33/508 |
| 2018/0198038 A1* | 7/2018 | Sato | H01L 25/167 |
| 2019/0103526 A1* | 4/2019 | Miyoshi | H01L 33/505 |
| 2019/0154236 A1* | 5/2019 | Ozeki | F21V 9/32 |
| 2019/0198729 A1* | 6/2019 | Hayashi | H01L 33/505 |
| 2019/0198738 A1* | 6/2019 | Nakabayashi | H01L 33/642 |
| 2019/0280167 A1* | 9/2019 | Hiraoka | H01L 33/60 |
| 2019/0280179 A1* | 9/2019 | Yamasaki | H01L 25/0753 |
| 2020/0041085 A1* | 2/2020 | Miyairi | F21S 41/143 |

FOREIGN PATENT DOCUMENTS

| | | |
|---|---|---|
| JP | 2009-218274 | 9/2009 |
| JP | 2012-004474 | 1/2012 |
| JP | 2012-038889 | 2/2012 |
| JP | 2012-156180 | 8/2012 |
| JP | 2014-112635 | 6/2014 |
| JP | 2014/120722 | 6/2014 |
| WO | WO 2010/061592 | 6/2010 |

OTHER PUBLICATIONS

Notice of Allowance with Form PTO-892 Notice of References Cited issued by the United States Patent and Trademark Office for U.S. Appl. No. 14/870,009, dated Oct. 12, 2016.

Office Action with Form PTO-892 Notice of References Cited issued by the U.S. Patent and Trademark Office for the parent U.S. Appl. No. 15/403,179, dated Jul. 3, 2017.

Notice of Allowance with Form PTO-892 Notice of References Cited issued by the United States Patent and Trademark Office for the parent U.S. Appl. No. 15/403,179, dated Dec. 6, 2017.

* cited by examiner

METHOD OF MANUFACTURING LIGHT EMITTING DEVICE

CROSS-REFERENCE TO RELATED APPLICATIONS

The present application is a divisional application of the U.S. patent application Ser. No. 15/403,179 filed on Jan. 11, 2017, which is a divisional application of the U.S. patent application Ser. No. 14/870,009 filed on Sep. 30, 2015, which claims priority under 35 U. S. C. § 119 to Japanese Patent Application No. 2014-202194, filed Sep. 30, 2014. The contents of these applications are incorporated herein by reference in their entirety.

BACKGROUND

Technical Field

The present disclosure relates to a method of manufacturing a light emitting device.

Discussion of the Background

Currently, a semiconductor light emitting device which subjects light of a light emitting element to wavelength conversion with a phosphor and emits white light by the light from the light emitting element and light from the phosphor is used as a light source of an illumination device such as general lighting, street light, or a head lamp. Of these described above, for example, for the street light and the head lamp, a light emitting device with high front luminance is required, and various light emitting devices have been conventionally suggested.

For example, Japanese Unexamined Patent Application Publication No. 2009-218274 suggests a light emitting device including a wavelength conversion layer and a reflective member for the purpose of ensuring high front luminance. The wavelength conversion layer is disposed on the upper portion of the light emitting element, converts the wavelength of light from a light-emitting element, and is formed of a light transmissive member containing a phosphor. The reflective member is disposed adjacently to a side surface of this wavelength conversion layer and a side surface of the light emitting element.

Moreover, for the purpose of improving phosphor concentration, Japanese Unexamined Patent Application Publication No. 2014-120722 suggests a light emitting device including a wavelength conversion member disposed on an upper surface of a light emitting element with a bonding layer in between, a light transmissive member disposed on an upper surface of the wavelength conversion member integrally therewith, and a light reflective member disposed along side surfaces of the light emitting element, the wavelength conversion member, and the light transmissive member.

For the purpose of reducing color unevenness on a light emitting surface, Japanese Unexamined Patent Application Publication No. 2012-156180 suggests a light emitting device including a phosphor-containing resin layer disposed on a light emitting element, and a plate-like optical layer loaded on the phosphor-containing resin layer, wherein the phosphor concentration of the phosphor-containing resin layer is different between a surrounding region of the light emitting element and a region immediately thereabove.

SUMMARY OF THE INVENTION

According to one aspect of the present invention, a method of manufacturing a light emitting device, includes providing a light emitting element having an element upper surface, an element lower surface opposite to the element upper surface in a thickness direction of the light emitting element, and an element side surface between the element upper surface and the element lower surface. A wavelength converter having a converter lower surface is provided. The wavelength converter is joined to the light emitting element using an adhesive so that the converter lower surface faces the element upper surface. The converter lower surface has an exposed region that does not face the element upper surface viewed along the thickness direction. The adhesive covers the element side surface and the exposed region.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1A:
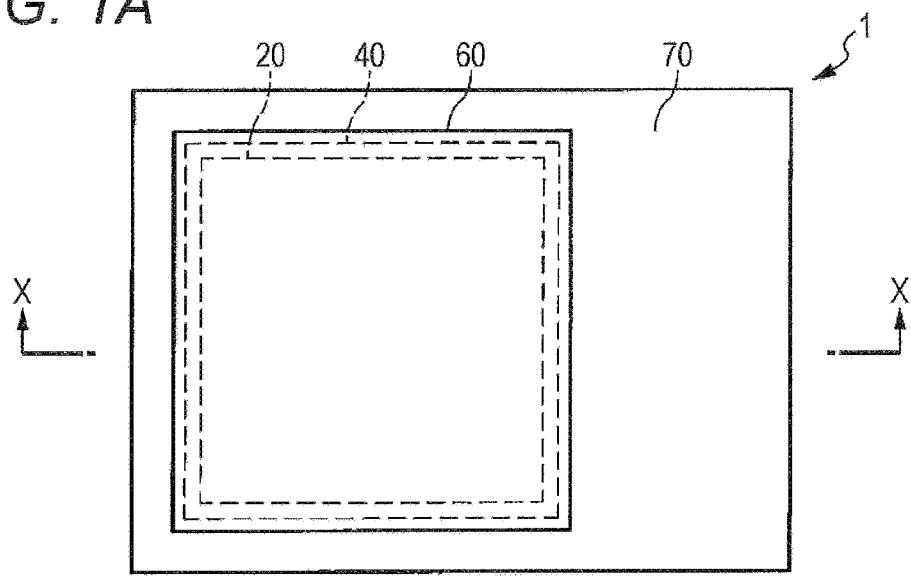
FIG. 1A is a view schematically showing a configuration of a light emitting device according to a first embodiment of the present invention and a plan view of the light emitting device.

The embodiments will now be described with reference to the accompanying drawings, wherein like reference numerals designate corresponding or identical elements throughout the various drawings.

Hereinafter, a light emitting device and a method of manufacturing a light emitting device as one example of the embodiments of the present invention will be described with reference to the accompanying drawings. The drawings for reference in the following description schematically show the embodiments of the present invention, and thus scales, intervals, positional relationship, or the like, of members may be exaggerated or the members may be partially omitted from illustration. Moreover, in the following description, the same names and numerals basically show the same or similar members, and will be omitted from the detailed description when appropriate.

First Embodiment

Configuration of Light Emitting Device

Figure 1B:
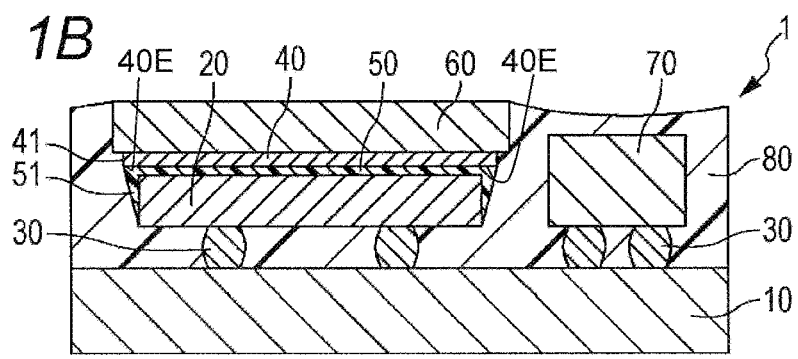
FIG. 1B is a sectional view schematically showing the configuration of the light emitting device according to the first embodiment, taken along X-X of FIG. 1A.

The configuration of a light emitting device 1 according to the first embodiment will be described with reference to FIGS. 1A to 1C. The light emitting device 1 can be used as, for example, a light source of a general lighting or an on-vehicle light emitting device. As shown in FIGS. 1A and 1B, the light emitting device 1 includes a substrate 10, a light emitting element 20, conductive members 30, a wavelength converter (hereinafter referred to as a wavelength conversion member) 40, a light guider (hereinafter referred to as a side light guide member) 51, a light transmitting layer (hereinafter referred to as a light transmissive member) 60, a semiconductor element 70, and a reflector (hereinafter referred to as a light reflective member) 80.

The substrate 10 is provided for installation of various members forming the light emitting device 1 thereon. Here, although omitted from illustration in FIG. 1B, a wiring portion (conductive pattern) for electrically connecting an external power source and the light emitting element 20 is formed on a surface of the substrate 10 with positive and negative electrodes dielectrically insulated from each other. Mounted on this wiring portion are the light emitting element 20 and the semiconductor element 70 described later, with the conductive members 30 in between.

As a material of the substrate 10, it is preferable to use an insulating material through which light from the light emitting element 20 and external light are hardly transmitted, and examples of the insulating material to be used include ceramics such as alumina, aluminum nitride, and LTCC, and a resin material such as a phenol resin, an epoxy resin, a polyimide resin, a BT resin, and polyphthalamide. Moreover, a composite material of an insulating material and a metallic member can be used. In a case where a resin is used as the material of the substrate 10, an inorganic filler such as glass fibers, silicon oxide, titanium oxide, or alumina may be mixed with the resin when needed. This can achieve an improvement in mechanical strength, decrease in coefficient of thermal expansion, and an improvement in optical reflectance. Note that the thickness of the substrate 10 is not particularly specified and the substrate 10 can be formed into any thickness in accordance with a purpose and application.

For the light emitting element 20, it is preferable to use a light emitting diode having semiconductor layers composed of an n-type semiconductor layer, a p-type semiconductor layer, and an emission layer, and the one of any wavelength can be selected depending on a purpose and application. For example, for a blue light emitting element 20 (emitting light of a wavelength of 430 nm to 490 nm) and a green light emitting element 20 (emitting light of a wavelength of 490 nm to 570 nm), ZnSe, a nitride-based semiconductor (In$_X$Al$_Y$Ga$_{1-X-Y}$N, $0 \leq X$, $0 \leq Y$, $X+Y \leq 1$), or GaP can be used. Moreover, for a red light emitting element 20 (emitting light of a wavelength of 620 nm to 750 nm), for example, GaAlAs or AlInGaP can be used. In a case where a light emitting device 1 using a phosphor is provided, it is preferable to use a nitride semiconductor (In$_X$Al$_Y$Ga$_{1-X-Y}$N, $0 \leq X$, $0 \leq Y$, $X+Y \leq 1$) capable of emitting light of a short wavelength which efficiently exciting the phosphor. Moreover, component composition, a color of emitted light, a size, or the like, of the light emitting element 20 can be appropriately selected depending on a purpose and application.

The conductive member 30 is provided for the purpose of conducting the light emitting element 20 and the wiring portion (not shown) on the substrate 10. As the conductive member 30, for example, a bump composed of Au or its alloy, eutectic solder such as Au—Sn, Pb—Sn, or lead-free solder can be used. FIG. 1B shows an example using a bump for the conductive member 30, but the conductive member 30 is not limited to the bump, and may be, for example, a conductive paste.

The wavelength conversion member 40 absorbs at least part of light from the light emitting element 20 and converts its wavelength into a different wavelength. As shown in FIG. 1B, the wavelength conversion member 40 has a surface which is larger than an upper surface of the light emitting element 20 and which is joined to the upper surface of the light emitting element 20 with an adhesive (hereinafter referred to as a bonding member) 50 described later in between. As shown in FIG. 1A, the wavelength conversion member 40 covers the upper surface of the light emitting element 20 in a plan view and also has a lower surface whose area is larger than that of the upper surface of the light emitting element 20. That is, as shown in FIG. 1C, the wavelength conversion member 40 is formed into a size which projects outwardly from a region immediately above the light emitting element 20. Here, "the upper surface of the light emitting element 20" means a surface of the light emitting element 20 on a side to which the wavelength conversion member 40 is joined. Moreover, "the upper surface of the wavelength conversion member 40" means a surface of the wavelength conversion member 40 on a side to which the light transmissive member 60 is disposed, and "the lower surface of the wavelength conversion member 40" described above means a surface of the wavelength conversion member 40 on a side on which the light emitting element 20 is mounted.

The upper surface of the wavelength conversion member 40 is formed to have a smaller area than a lower surface of the light transmissive member 60 described later in a plan view, as shown in FIGS. 1A and 1B. For example, in a case where the light emitting element 20 has a size of 1-mm square, the upper surface of the wavelength conversion member 40 has a side which is smaller than that of the lower surface of the light transmissive member 60 by 15 µm to 50 µm in length. Here, "the lower surface of the light transmissive member 60" means a surface of the light transmissive member 60 on a side on which the wavelength conversion member 40 is disposed.

Specifically, a side surface 41 of the wavelength conversion member 40 is located on an inner side than a side surface of the light transmissive member 60 by 15 µm to 50 µm. Then, in a region on a lower edge surface of the light transmissive member 60 where the wavelength conversion member 40 is not formed, the light reflective member 80 described later is provided. As shown in FIG. 1C, the side surface 41 of the wavelength conversion member 40 is formed approximately perpendicularly to the lower surface of the light transmissive member 60. Then, the side light guide member 51 described later is formed continuously from a lower corner part of the side surface 41 of the wavelength conversion member 40 to a lower corner part of a side surface of the light emitting element 20.

The wavelength conversion member 40 to be used can be formed by mixing a light transmissive material such as a resin, glass, and an inorganic substance as a binder of a phosphor, for example. Examples of the binder include an organic resin binder such as an epoxy resin, a silicone resin, a phenol resin, and a polyimide resin, and an inorganic binder such as glass. An example of the phosphor includes an yttrium-aluminum-garnet-based phosphor (YAG-based phosphor) which is a representative phosphor capable of emitting whitish mixed light in favorable combination with a blue light emitting element. In case of the light emitting device 1 capable of emitting white light, the concentration of the phosphor contained in the wavelength conversion member 40 is adjusted so as to permit white light emission. Moreover, it is preferable that the concentration of the phosphor is, for example, approximately 5% to 50%.

Further, it is also possible to achieve emission of light of an amber color by using a blue light emitting element for the light emitting element 20 and using the YAG-based phosphor and a nitride-based phosphor, rich with red components, for the phosphor. The amber color corresponds to a chromaticity range of a region composed of a long wavelength region of a yellow color and a short wavelength region of a yellow-red color in accordance with JIS Z8110 and a region in between a yellow region and the yellow red short wavelength region in accordance with JIS Z9101 concerning safe color, and corresponds to a region within a range between 580 nm and 600 nm, for example, in terms of a dominant wavelength. Many of phosphors emitting light of the amber color have a low light exchange efficiency, and are desired to increase the phosphor concentration in order to obtain a desired color tone. Moreover, although there is a concern that the heat generation of the phosphor is greater than that of another phosphor, the embodiment of the present invention makes it possible to increase the phosphor concentration of the wavelength conversion member 40 and also reduces its thickness, thus permitting favorable use of the phosphor emitting light of the amber color.

The YAG-based phosphor is a general term of a garnet structure containing Y and Al, and is a phosphor activated by at least one kind of element selected from rare earth elements, and is excited by blue light emitted from the light emitting element 20 to emit light. An example of the YAG-based phosphor to be used includes $(Re_{1-x}Sm_x)_3(Al_{1-y}Ga_y)_5O_{12}$: Ce ($0 \leq x < 1$, $0 \leq y \leq 1$, where Re is at least one kind of element selected from the group consisting of Y, Gd, and La).

Moreover, a nitride-based phosphor is a phosphor which is activated by at least one kind of rare earth element selected from the group consisting of Y, La, Ce, Pr, Nd, Sm, Eu, Gd, Tb, Dy, Ho, Er, and Lu and which contains at least one kind of group II element selected from the group consisting of Be, Mg, Ca, Sr, Ba, and Zn; at least one kind of group IV element selected from the group consisting of C, Si, Ge, Sn, Ti, Zr, and Hf; and N. The nitride-based phosphor may contain O in the composition.

The nitride-based phosphor to be used can be expressed by the general formula $L_XM_YN_{((2/3)X+(4/3)Y)}$: R or $L_XM_YO_ZN_{((2/3)X+(4/3)Y-(2/3)Z)}$: R (where L is at least one kind of group II element selected from the group consisting of Be, Mg, Ca, Sr, Ba, and Zn; M is at least one kind of group IV element selected from the group consisting of C, Si, Ge, Sn, Ti, Zr, and Hf; R is at least one kind of rare earth element selected from the group consisting of Y, La, Ce, Pr, Nd, Sm, Eu, Gd, Tb, Dy, Ho, Er, and Lu; and X, Y, and Z respectively satisfy $0.5 \leq X \leq 3$, $1.5 \leq Y \leq 8$, $0 < Z \leq 3$).

As the phosphor, other than the YAG-based phosphor and the nitride-based phosphor, any of those known in the fields, such as a nitride oxide phosphor, KSF ($K_2SiF_6$:Mn)-based phosphor, or sulfide-based phosphor, can be appropriately used. These phosphors can be used in a combination or a blending ratio suitable for a desired color tone, to adjust color rendering properties and color reproducibility.

The wavelength conversion member 40 may use a light-emitting substance referred to as so-called nanocrystals, quantum dot. Examples of such a material can include a semiconductor material such as group II-VI, group III-V, or group IV-VI semiconductor, more specifically, highly-scattering nano-size particles such as CdSe, a core-shell type $CdS_xSe_{1-x}$/ZnS, GaP, and InAs. The particle diameter of such a phosphor can be, for example, 1 nm to 100 nm, and preferably approximately 1 nm to 20 nm (approximately 10 to 50 atoms). Use of the wavelength conversion member 40 can suppress inside scattering and scattering of light subjected to color conversion, and further improve light transmittance.

The wavelength conversion member 40 may be formed of a single layer with one kind of member, a single layer with two or more kinds of members in combination, or two or more single layers stacked on each other. To the wavelength conversion member 40, a light diffusing member may be added when needed. A thickness of the wavelength conversion member 40 can be, for example, 20 µm to 100 µm, and preferably 20 µm to 50 µm. If the thickness of the wavelength conversion member 40 is greater than 100 µm, the heat dissipation property tends to deteriorate. Moreover, in terms of heat dissipation property, a smaller thickness of the wavelength conversion member 40 is more preferable, but too small thickness of the wavelength conversion member 40 reduces an amount of phosphors, resulting in tendency to reduce a chromaticity range of emitted light. In view of this, the wavelength conversion member 40 has the appropriate thickness should be formed to have the appropriate thickness described above.

The side light guide member 51 guides light from the light emitting element 20 towards the wavelength conversion member 40. As shown in FIG. 1C, the side light guide member 51 is formed from the side surface of the light emitting element 20 to the lower edge surface (an exposed region 40E that does not face the upper surface of the light emitting element 20 in plain view) of the wavelength conversion member 40. Specifically, this side light guide member 51 is formed by extending the bonding member 50 joining the light emitting element 20 and the wavelength conversion member 40, from the side surface of the light emitting element 20 to the lower edge surface of the wavelength conversion member 40. That is, the side light guide member 51 is formed of the same material as that of the bonding member 50. Providing such a side light guide member 51 permits reflection of light exiting from the side surface of the light emitting element 20 and incidence of the light into the wavelength conversion member 40, improving the light conversion efficiency of the wavelength conversion member 40.

As the bonding member 50 forming the side light guide member 51, it is preferable to use a light transmissive material capable of effectively guiding the light exiting from the light emitting element 20 to the wavelength conversion member 40 and optically coupling together the light emitting element 20 and the wavelength conversion member 40. As the bonding member 50, for example, an organic resin such as an epoxy resin, a silicone resin, a phenol resin, and a polyimide resin can be used, and it is preferable to use a silicone resin. A smaller thickness of the bonding member 50 formed between the light emitting element 20 and the wavelength conversion member 40 is preferable, whereby the heat dissipation property improves and loss of light transmitted through the bonding member 50 between the light emitting element 20 and the wavelength conversion member 40 decreases. Thus, optical output of the light emitting device 1 improves.

Figure 1C:
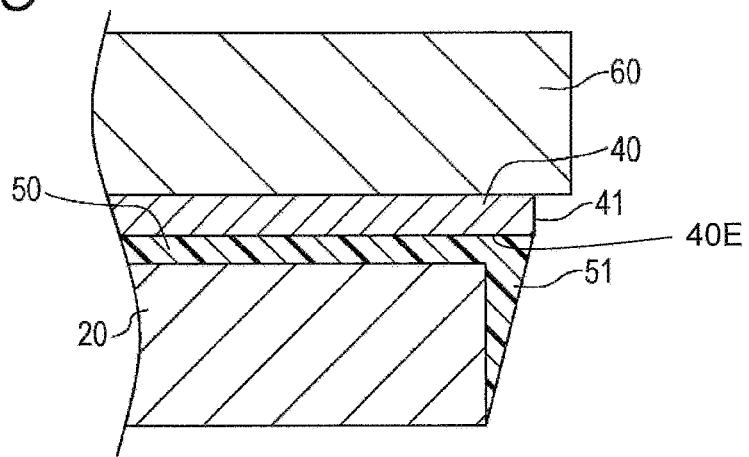
FIG. 1C is a sectional view schematically showing the configuration of the light emitting device according to the first embodiment on a partially enlarged scale of FIG. 1B.

In a sectional view vertically cut as shown in FIG. 1C, the side light guide member 51 is funned into a sectionally triangle shape in which the bonding member 50 extends on the side surface of the light emitting element 20 and at a corner part of the lower edge surface of the wavelength conversion member 40 and the thickness of the bonding member 50 decreases towards the lower surface of the light emitting element 20. As shown in FIG. 1B, a light reflective member 80 described below is disposed so as to make contact with the side light guide member 51 having this sectionally triangle shape. As a result, the light exiting from the side surface of the light emitting element 20 is reflected on an interface between the side light guide member 51 having this sectionally triangle shape and the light reflective member 80, and is made incident on the edge of the wavelength conversion member 40 projecting outwardly from the upper surface of the light emitting element 20, further improving luminance of the emitted light of the light emitting device 1.

Here, the side light guide member 51 can be formed by, for example, upon joining the wavelength conversion member 40 formed on a lower surface of the light transmissive member 60 with the light emitting element 20, dropping the bonding member 50 on the upper surface of this light emitting element 20 and extending, up to the side surface of the light emitting element 20, an excessive amount of the bonding member 50 which is the rest of the bonding member 50 required for the bonding with the upper surface of the light emitting element 20. The sectionally triangle shape of the side light guide member 51 can be formed by optimizing wettability and viscosity of the silicone resin to the side surface of the light emitting element 20 and the lower surface of the wavelength conversion member 40.

Further, in a case where the silicone resin is used as a binder of the wavelength conversion member 40, it is also preferable to use a silicone resin for the bonding member 50. This consequently can reduce a difference in refractive index between the wavelength conversion member 40 and the bonding member 50, thus making it possible to increase light incident on the wavelength conversion member 40 from the bonding member 50.

The light transmissive member 60 is a member provided separately from the wavelength conversion member 40 containing a phosphor, and is provided for the purpose of supporting the wavelength conversion member 40 formed on its lower surface. In a cross section of the light emitting device 1 as shown in FIG. 1B, the light transmissive member 60 is disposed on the upper surface of the wavelength conversion member 40. Moreover, as shown in FIG. 1A, the light transmissive member 60 covers the upper surface of the light emitting element 20 and the upper surface of the wavelength conversion member 40, and the lower surface of the light transmissive member 60 has a larger area than both the upper surface of the light emitting element 20 and the upper surface of the wavelength conversion member 40. That is, as shown in FIG. 1C, the light transmissive member 60 is formed into such a size that the light transmissive member 60 projects outwardly from a region immediately above the light emitting element 20 and a region immediately above the wavelength conversion member 40.

As the light transmissive member 60, a plate-like body formed of a light transmissive material such as glass or a resin can be used. As the glass, for example, borosilicate glass or quartz glass can be used, and as the resin, for example, a silicone resin or an epoxy resin can be used. Note that the light transmissive member 60 may include a light diffusing member. Increasing the phosphor concentration of the wavelength conversion member 40 described above tends to cause color unevenness, but the light diffusing member included in the light transmissive member 60 can suppress the color unevenness and luminance unevenness. As the light diffusing member, for example, titanium oxide, barium titanate, aluminum oxide, or silicon oxide can be used.

The light transmissive member 60 may have any thickness which can provide the wavelength conversion member 40 with sufficient mechanical strength without reducing mechanical strength during the production. Since too large thickness of the light transmissive member 60 leads to a trouble for downsizing of the light emitting device 1 or lower the heat dissipation property, it is preferable to provide an appropriate thickness in view of this. Moreover, the upper surface of the light transmissive member 60, serving as a light emitting surface, is not limited to a flat surface, and may have small irregularities. Forming of the small irregularities on such a light emitting surface makes it possible to promote scattering of light exiting from this light emitting surface and further suppress the luminance unevenness and the color unevenness.

The light emitting device 1 includes a semiconductor element 70 disposed on the substrate 10 separately from the light emitting element 20 but adjacently to this light emitting element 20. As the semiconductor element 70, another light emitting element not intended for light emission of the light emitting device 1, a transistor for controlling the light emitting element or a protective element can be used.

The protective element described above is an element for protecting the light emitting element 20 from element breakage or performance degradation caused by excessive voltage application, and is specifically formed of a Zener diode that turns into an electrified state as a result of application of a voltage equal to or greater than a specified voltage. The protective element is electrically connected by the conductive member 30 inversely in parallel to a p-electrode and an n-electrode of the light emitting element 20. This can consequently prevent a voltage across the p- and n-electrodes of the light emitting element 20 from becoming equal to or greater than the Zener voltage, and can appropriately prevent occurrence of the element breakage and the performance degradation of the light emitting element 20 caused by the application of excessive voltage.

The light reflective member 80 is provided for reflecting the light emitted from the light emitting element 20. As shown in FIG. 1B, the light reflective member 80 is disposed so as to cover all the members disposed on the substrate 10, and is disposed at least on the side surfaces of the wavelength conversion member 40, the light transmissive member 60, and the side light guide member 51. As a result, the light reflective member 80 permits the light exiting from the light emitting element 20 to be incident on the wavelength conversion member 40. More specifically, the light reflective member 80 is disposed not only on the side surfaces of the wavelength conversion member 40, the light transmissive member 60, and the side light guide member 51, but also on the lower surface of the light-emitting element 20 and a lower surface, side surfaces, and an upper surface of the semiconductor element 70.

As the light reflective member 80, an insulating material is preferably used, or for the purpose of ensuring some degree of strength, for example, a thermosetting resin or a thermoplastic resin can be used. The light reflective member 80 can be formed by using a resin such as a silicone resin, a modified silicone resin, an epoxy resin, a modified epoxy resin, an acrylic resin, a phenol resin, a BT resin, and PPA or a hybrid resin containing at least one kind of these resins, and a light reflective member. Of these substances described above, as a base polymer, it is preferable to use a resin that contains a silicone resin with an excellent heat resistance, an excellent electrical insulating property, and flexibility. Examples of the light reflective member 80 include titanium oxide, silicon oxide, zirconium oxide, magnesium oxide, calcium carbonate, calcium hydroxide, calcium silicate, zinc oxide, barium titanate, potassium titanate, alumina, aluminum nitride, boron nitride, and mullite. Of these substances, titanium oxide is preferable since it is stable for moisture, or the like, and has high refractive index.

With the light emitting device 1 having the configuration described above, light exiting from the side of the light emitting element 20 can be extracted to the front by use of the side light guide member 51, and providing a smaller area for the upper surface of the wavelength conversion member 40 than for the lower surface of the light transmissive member 60 to reduce a surface on which the wavelength conversion member 40 makes contact with the light transmissive member 60 can reduce a yellow light component of the end part of the light emitting surface. Therefore, with the light emitting device 1, front luminance can be improved and, at the same time, occurrence of color unevenness at an outer circumferential part of the light emitting surface can be reduced.

Method of Manufacturing Light Emitting Device

Hereinafter, the method of manufacturing the light emitting device 1 according to the first embodiment of the present invention will be described with reference to FIGS. 2A to 2E and FIGS. 3A to 3C. In the method of manufacturing the light emitting device 1, a wavelength conversion member preparation step (FIG. 2A), a groove part forming step (FIGS. 2B and 2C), a division step (FIGS. 2D and 2E), a light emitting element mounting step (FIG. 3A), a wavelength conversion member joining step (FIG. 3B), and a light reflective member arrangement step (FIG. 3C) are performed in order.

Figure 2A:
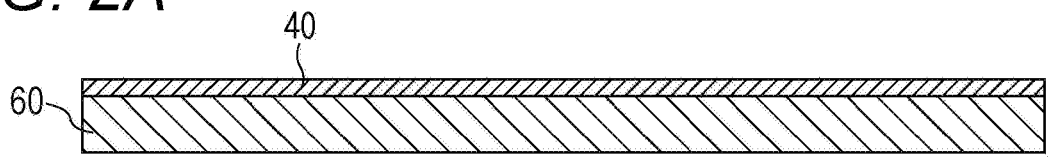
FIG. 2A is a sectional view schematically showing a method of manufacturing the light emitting device according to the first embodiment, with a wavelength conversion member preparation step.

The wavelength conversion member preparation step is a step of preparing the light transmissive member 60 having the wavelength conversion member 40 formed on its lower surface. In the wavelength conversion member preparation step, the light transmissive member 60 sufficiently larger than a plurality of light emitting elements 20 is prepared, and as shown in FIG. 2A, this light transmissive member 60 is used as a support and the wavelength conversion member 40 is formed on the lower surface of the light transmissive member 60. As a method of forming the wavelength conversion member 40, printing, compression molding, a phosphor electrodeposition method, a phosphor sheet method, or the like, can be used. In the description below, the lower surface of the light transmissive member 60 means a surface on a side of the light transmissive member 60 on which the wavelength conversion member 40 is disposed, as is the case with FIG. 1B.

Here, in a case where the printing is used, paste containing a phosphor, a binder, and a solvent is prepared, and this paste is applied to the lower surface of the light transmissive member 60, and dried to thereby form the wavelength conversion member 40. As the binder described above, an organic resin binder such as an epoxy resin, a silicone resin, a phenol resin, or a polyimide resin or an inorganic binder such as glass can be used. In a case where the compression molding is used, a material of the wavelength conversion member 40 containing a phosphor in a binder is molded with a die to thereby form the wavelength conversion member 40 on the lower surface of the light transmissive member 60. In a case where the phosphor electrodeposition method is used, an electrically-conductive, thin film capable of having light transmissive property is formed and the charged phosphor is cumulated on the thin film by use of electrophoresis to thereby form the wavelength conversion member 40 on the lower surface of the light transmissive member 60. In a case where the phosphor sheet method is used, a phosphor is kneaded with a silicone resin to form a phosphor sheet machined into a sheet-like shape. The wavelength conversion member 40 is formed from the phosphor sheet.

Figure 2B:
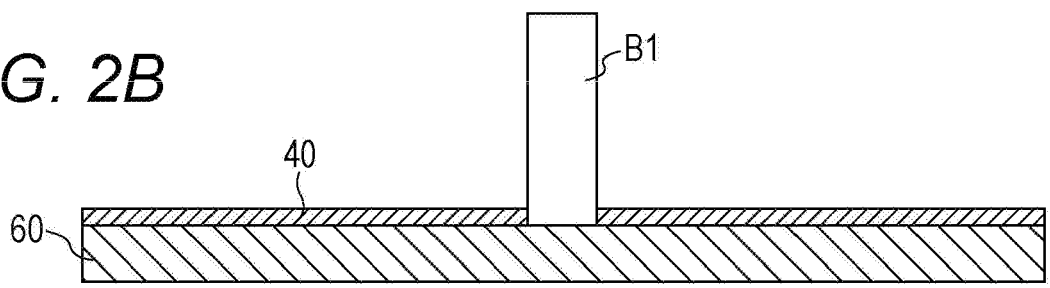
FIG. 2B is a sectional view schematically showing the method of manufacturing the light emitting device according to the first embodiment, with a groove part forming step.
Figure 2C:
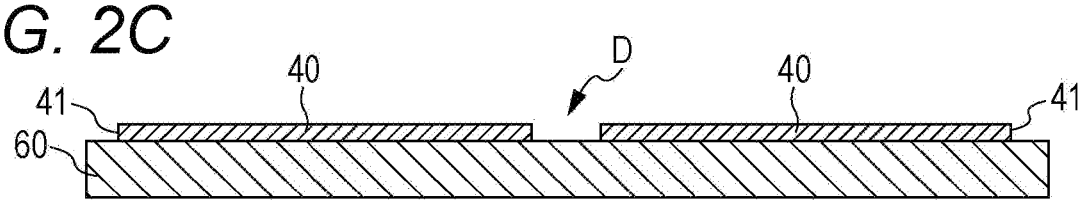
FIG. 2C is a sectional view schematically showing the method of manufacturing the light emitting device according to the first embodiment, with the wavelength conversion member divided through the groove part forming step.

The groove part forming step is a step of forming a groove part at the wavelength conversion member 40 provided on the light transmissive member 60. Here, the groove part is provided for zoning the light transmissive member 60 for the individual light emitting element 20. In the groove part framing step, as shown in FIG. 2B, a blade B1 having a predetermined width (thick blade) is used to substantially perpendicularly divide the wavelength conversion member 40 to form a groove part D as shown in FIG. 2C. Here, in the groove part forming step, it is preferable to use the blade B1 whose width is larger than that of a blade B2 in the division step described later by approximately 30 μm to 100 μm. As a result, as described later, the upper surface of the wavelength conversion member 40 can be formed to have a smaller area than the lower surface of the light transmissive member 60 in a plan view (see FIG. 2E). In the groove part forming step, the groove part D is formed in such a manner that the upper surface of the wavelength conversion member 40 covers the upper surface of the light emitting element 20 described later (see FIG. 3A) and has a greater area than that of the upper surface of the light emitting element 20 to thereby divide wavelength conversion member 40. In the groove part forming step, as shown in FIG. 2B, the groove part D is formed on the wavelength conversion member 40 while the lower surface of the light transmissive member 60 faces upward.

In FIG. 2B, as one example of the groove part forming step, the blade B1 is used, but in the groove part forming step, instead of the blade B1, laser light may be used to divide the wavelength conversion member 40, or etching may be adopted to divide the wavelength conversion member 40.

Figure 2D:
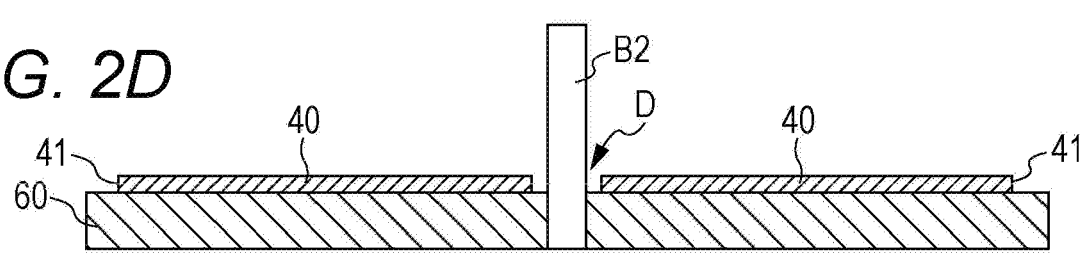
FIG. 2D is a sectional view schematically showing the method of manufacturing the light emitting device according to the first embodiment, with a division step.
Figure 2E:
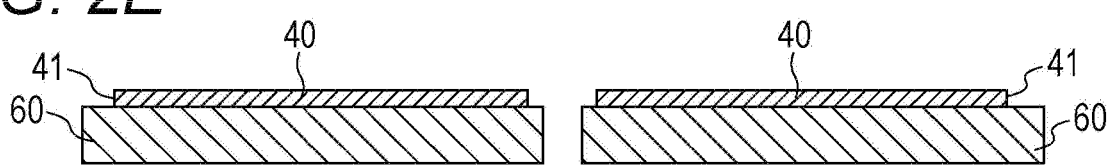
FIG. 2E is a sectional view schematically showing the method of manufacturing the light emitting device according to the first embodiment, with a light transmissive member divided through the division step.

The division step is a step of dividing the light transmissive member 60 at the groove part D. In the division step, as shown in FIG. 2D, the blade (thin blade) B2 having a predetermined width is used to divide the light transmissive member 60 so as to pass through a center of the groove part D formed in the groove part forming step. Here, in the division step, it is preferable to use the blade B2 whose width is smaller than that of the blade B1 in the groove part forming step described above by approximately 30 μm to 100 μm. As a result, as shown in FIG. 2E, the upper surface of the wavelength conversion member 40 can be formed with one side which is smaller in length than the lower surface of the light transmissive member 60 by 15 μm to 50 μm in a plan view. Moreover, in the division step, the light transmissive member 60 is divided in such a manner that the light transmissive member 60 covers the upper surface of the light emitting element 20 in a plan view and the lower surface of the light transmissive member 60 has a larger area than the upper surface of the light emitting element 20. As a result, as shown in FIG. 2E, a level difference can be formed between the wavelength conversion member 40 and the light transmissive member 60.

In FIG. 2D, as one example of the division step, the division by use of the blade B2 has been illustrated, but instead of the blade B2, laser light may be used to divide the light transmissive member 60 in the division step.

Moreover, as described above, by forming the groove part D at the wavelength conversion member 40 with the thick blade B1 and then dividing the light transmissive member 60 with the thin blade B2, attachment of the wavelength conversion member 40 to the blade B2 at the time of dividing the light transmissive member 60 can be prevented. Performing the forming of the groove part D at the wavelength conversion member 40 and the division of the light transmissive member 60 with blades having the same width is likely to cause attachment of the wavelength conversion member 40 to the blade at the time of dividing the light transmissive member 60, resulting in risks that the wavelength conversion member 40 is attached to a division surface at the time of division or degradation of blade rotation occurs and thus work efficiency deteriorates. From these viewpoints, it is preferable that the upper surface of the wavelength conversion member 40 has a smaller area than the lower surface of the light transmissive member 60.

Figure 3A:
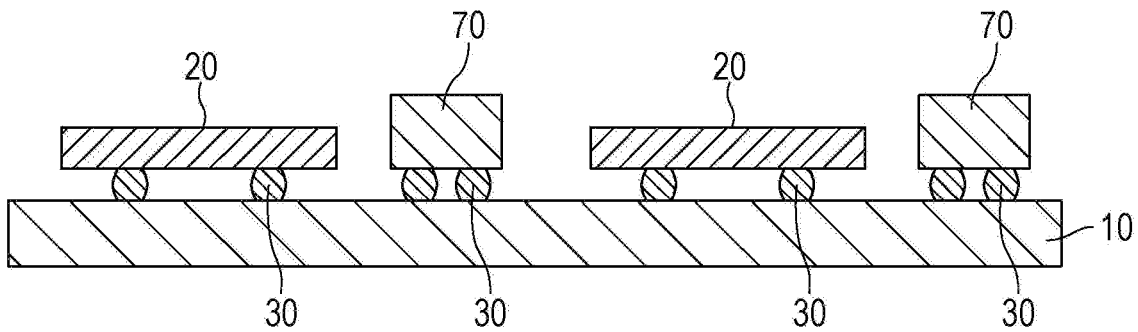
FIG. 3A is a sectional view schematically showing the method of manufacturing the light emitting device according to the first embodiment, with a light emitting element mounting step.

The light emitting element mounting step is a step of mounting the light emitting element 20 on the substrate 10. In the light emitting element mounting step, as shown in FIG. 3A, a plurality of light emitting elements 20 are mounted on the wiring portion (not shown) on the substrate 10 with the conductive members 30 in between. Similarly, on the substrate 10 between the light emitting element 20 and the light emitting element 20 adjacent thereto, the semiconductor element 70 is mounted. As a method of mounting the light emitting element 20 and the semiconductor element 70, flip-chip mounting can be used. Note that, the mounting of the semiconductor element 70 is not necessary and can be omitted.

Figure 3B:
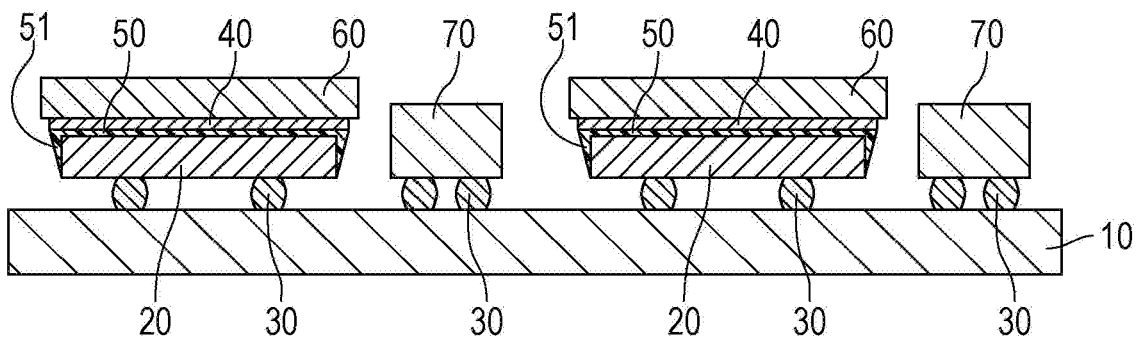
FIG. 3B is a sectional view schematically showing the method of manufacturing the light emitting device according to the first embodiment, with a wavelength conversion member joining step.

The wavelength conversion member joining step is a step of joining the wavelength conversion member 40 formed on the lower surface of the light transmissive member 60 as shown in FIG. 2E to the upper surface of the light emitting element 20 shown in FIG. 3A with the bonding member 50 in between. In the wavelength conversion member joining step, as shown in FIG. 3B, the wavelength conversion member 40 formed on the lower surface of the light transmissive member 60 in advance, with its side being oriented to face the upper surface of the light emitting element 20, is joined to the upper surface of the light emitting element 20 with the bonding member 50 in between.

Here, in the wavelength conversion member joining step, by pressing the light transmissive member 60, the bonding member 50 provided between the light emitting element 20 and the wavelength conversion member 40 extends from the side surface of the light emitting element 20 to the lower edge surface of the wavelength conversion member 40 and form the side light guide member 51. Specifically, in the wavelength conversion member joining step, when joining of the wavelength conversion member 40 to the light emitting element 20, a larger amount of the bonding member 50 is applied to the upper surface of the light emitting element 20 and an excessive amount of the bonding member 50 which is the rest of the bonding member 50 required for the bonding with the upper surface of the light emitting element 20 is extended on the side surface of the light emitting element 20, thereby forming the side light guide member 51 having a sectionally triangle shape as shown in FIG. 3B.

The bonding member 50 extends on the side surface of the light emitting element 20 to form the side light guide member 51, but reach of the bonding member 50 extending on the side surface of the light emitting element 20 at an upper surface of the substrate 10 brings about a risk that the light exiting from the light emitting element 20 is made incident on the upper surface of the substrate 10 through the bonding member 50 and is thus absorbed by the substrate 10. Thus, viscosity and an amount of the bonding member 50 need to be appropriately adjusted to such degrees that avoid the reach of the bonding member 50 at the upper surface of the substrate 10. More specifically, for example, considering exposure of a lower corner part of the side surface of the light emitting element 20 from the side light guide member 51 as a standard, the amount and viscosity of the bonding member 50 can be adjusted.

In the wavelength conversion member joining step, the light transmissive member 60 having a substantially rectangular shape in a plan view is disposed on the upper surface of the light emitting element 20 having a substantially rectangular shape in a plan view in such a manner that directions of their corner parts overlap with each other. The bonding member 50 dropped on the upper surface of the light emitting element 20 having a substantially rectangular shape in a plan view is pressed by the light transmissive member 60 to thereby widen horizontally through 360 degrees. Here, since the light emitting element 20 has a substantially rectangular shape in a plan view, the widened bonding member 50 spreads easily and quickly to each of center parts of the four side surfaces of the light emitting element 20, and finally reaches at the corner parts of the side surfaces of the light emitting element 20. There is a risk that the bonding member 50 extending all the side surfaces is pressed, then reaches at the lower surface of the light emitting element 20 or the substrate 10. That is, exposure of the lower corner parts of the light emitting element 20 from the bonding member 50 can be set as a standard that the bonding member 50 has not yet reached at the lower surface of the light emitting element 20 or the substrate 10, facilitating the management of manufacturing steps. It can be assumed that light release is small at a part (corner part) including intersections of the sides forming an outline of the light emitting element 20 having a substantially rectangular shape in a plan view, and thus light loss caused by exposing the lower corner part from the side light guide member 51 is minimized.

Moreover, the wavelength conversion member joining step can also be performed by adjusting an amount of the binder of the wavelength conversion member 40 while this binder is semicured. The semicured wavelength conversion member 40 can be pressed against the upper surface of the light emitting element 20 to thereby permit extension of part of the binder on the side surface of the light emitting element 20.

Figure 3C:
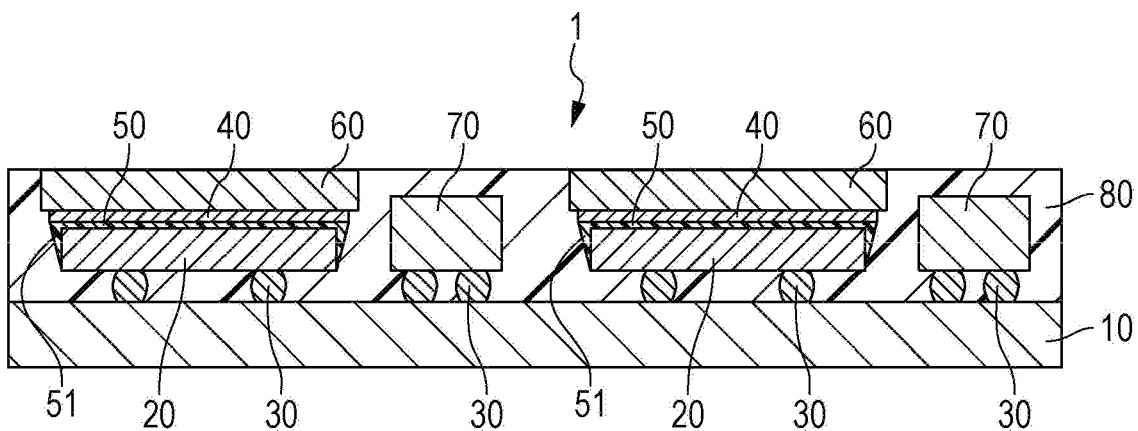
FIG. 3C is a sectional view schematically showing the method of manufacturing the light emitting device according to the first embodiment, with a light reflective member forming step.

The light reflective member arrangement step is, as shown in FIG. 3C, a step of arranging the light reflective member on the substrate 10 and, for example, around the light emitting element 20. In the light reflective member arrangement step, for example, a resin discharge device which can move, for example, in a vertical direction or a horizontal direction with respect to the substrate 10 is used to fill an upper side of the fixed substrate 10 with a resin forming the light reflective member 80.

With the method of manufacturing the light emitting device 1 for performing the steps as described above, the light guide member 51 is formed by extending the bonding member 50 from the side surface of the light emitting element 20 to the lower edge side of the wavelength conversion member 40 forms the side light, which extract the light emitted from the side of the light emitting element 20 to the front, and also makes an area of the upper surface of the wavelength conversion member 40 smaller than that of the lower surface of the light transmissive member 60 to reduce a surface on which the wavelength conversion member 40 makes contact with the light transmissive member 60. Therefore, the method of manufacturing the light emitting device 1 permits manufacturing of a light emitting device 1 capable of improving the front luminance and reducing the occurrence of ring-shaped color unevenness at an outer circumferential part of the light emitting surface.

Second Embodiment

Configuration of Light Emitting Device

Figure 4A:
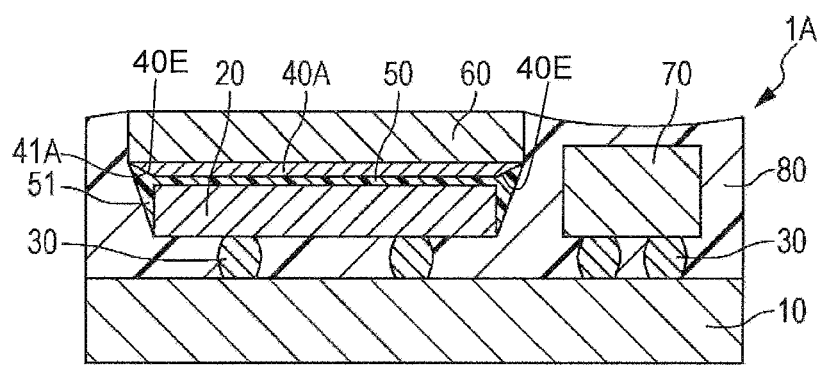
FIG. 4A is a sectional view schematically showing a configuration of a light emitting device according to a second embodiment.

The configuration of the light emitting device 1A according to the second embodiment will be described with reference to FIGS. 4A and 4B. As shown in FIG. 4A, the light emitting device 1A has the same configuration as the light emitting device 1 (see FIG. 1B) described above, except for a configuration of a wavelength conversion member 40A.

Figure 4B:
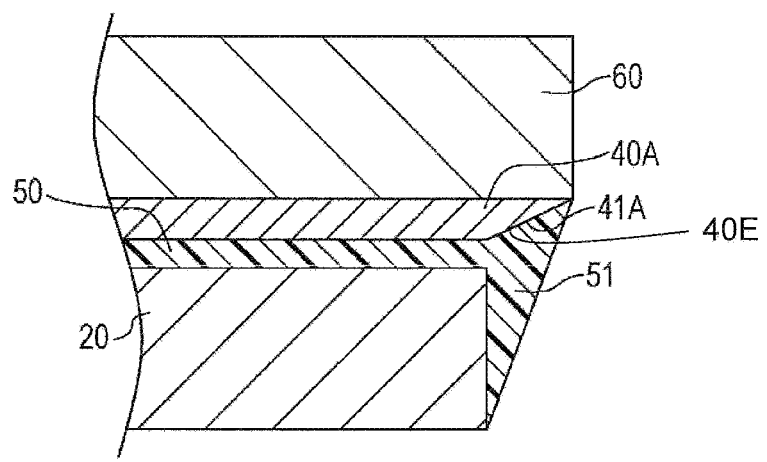
FIG. 4B is a sectional view schematically showing the configuration of the light emitting device according to the second embodiment on a partially enlarged scale of FIG. 4A.

As shown in FIG. 4B, the wavelength conversion member 40A of the light emitting device 1A has an upper surface whose area is equal to that of a lower surface of the light transmissive member 60. Moreover, the wavelength conversion member 40A has an end part, that is, a region located on an outer side of the light emitting element 20 in a plan view, more thinly formed than other regions. The wavelength conversion member 40A is formed in such a manner that its region located on the outer side of the light emitting element 20 becomes gradually thinner towards outer circumference.

More specifically, the wavelength conversion member 40A is formed in a constant thickness in a region (referred to as a first wavelength converter part) immediately above the light emitting element 20, and a side surface 41A of the wavelength conversion member 40A is inclined towards the outer circumference at the end part of the wavelength conversion member 40A, that is, in the region (referred to as a second wavelength converter part) located on the outer side of the light emitting element 20. In other words, in a region between the side surface of the light emitting element 20 and the side surface of the light transmissive member 60, the wavelength conversion member 40A is formed into a tapered shape so as to become thinner towards the outer circumference at a constant angle. A region in which the wavelength conversion member 40A is formed into a tapered shape, that is, the region between the side surface of the light emitting element 20 and the side surface of the light transmissive member 60 specifically has a width of 15 µm to 50 µm, if the light-emitting element 20 described above has a size of a 1-mm square, for example.

In the light emitting device 1A having the configuration described above, unlike the light emitting device 1 in which the wavelength conversion member 40A on a lower edge side of the light transmissive member 60 is not completely removed, the end part of the wavelength conversion member 40A is formed to be tapered towards the outer circumference, thereby permitting more precise adjustment of a yellow component of the end part of the light emitting surface, which can therefore more effectively reduce the color unevenness on the light emitting surface.

Method of Manufacturing Light Emitting Device

Hereinafter, the method of manufacturing the light emitting device 1A according to the second embodiment of the present invention will be described with reference to FIGS. 5A to 5E. In the method of manufacturing the light emitting device 1A, a wavelength conversion member preparation step (FIG. 5A), a groove part forming step (FIGS. 5B and 5C), a division step (FIGS. 5D and 5E), a light emitting element mounting step (FIG. 3A), a wavelength conversion member joining step (FIG. 3B), and a light reflective member arrangement step (FIG. 3C) are performed in order. Note that the light emitting element mounting step and the following steps are the same as those of the method of manufacturing the light emitting device 1 according to the first embodiment, and thus are omitted from the description.

Figure 5A:
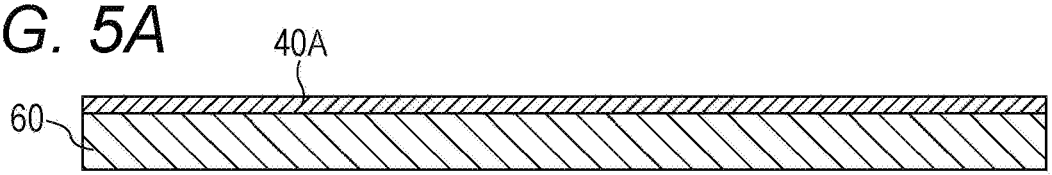
FIG. 5A is a sectional view schematically showing a method of manufacturing the light emitting device according to the second embodiment, with a wavelength conversion member preparation step.

In the wavelength conversion member preparation step, a light transmissive member 60 having a size sufficiently larger than that of a plurality of light emitting elements 20 is prepared, and as shown in FIG. 5A, printing, compression molding, a phosphor electrodeposition method, or a phosphor sheet method is used to form a wavelength conversion member 40A on the lower surface of the light transmissive member 60.

Figure 5B:
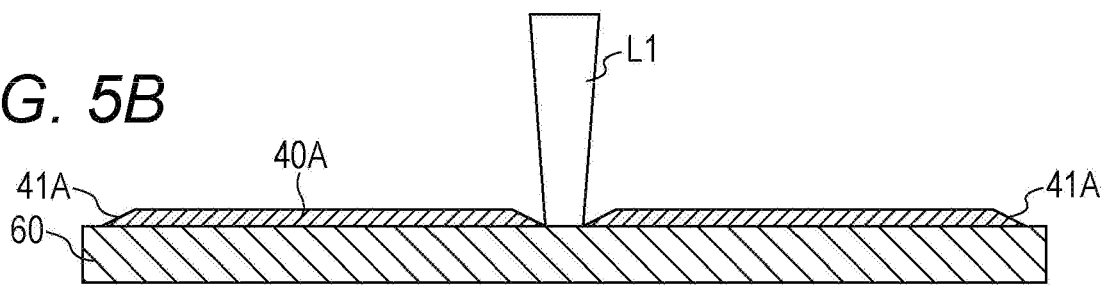
FIG. 5B is a sectional view schematically showing the method of manufacturing the light emitting device according to the second embodiment, with a groove part forming step.
Figure 5C:
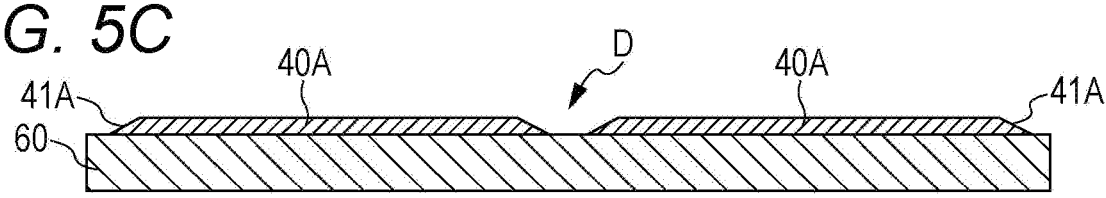
FIG. 5C is a sectional view schematically showing the method of manufacturing the light emitting device according to the second embodiment, with a wavelength conversion member divided through the groove part forming step.

In the groove part forming step, as shown in FIG. 5B, laser light L1 having a predetermined width is used to dice and divide the wavelength conversion member 40A, then form a groove part D as shown in FIG. 5C. Here, in the groove part forming step, adjusting a condition of the laser light L1, the groove part D is formed in such a manner that a region of the wavelength conversion member 40A located on an outer side of the light emitting element 20 is thinner than a region immediately above the light emitting element 20 in a plan view, more specifically, the wavelength conversion member 40A becomes gradually thinner towards the groove part D. As a result, the side surface 41A of the wavelength conversion member 40A is machined in a tapered shape. Moreover, in the groove part forming step, the groove part D is formed in such a manner that the wavelength conversion member 40A covers the upper surface of the light emitting element 20 and the lower surface of the wavelength conversion member 40A has a larger area than the upper surface of the light emitting element 20, thereby dividing the wavelength conversion member 40.

In FIG. 5B, as one example of the groove part forming step, the laser light L1 is used, but instead of the laser light L1, the wavelength conversion member 40A may be divided by a blade in the groove part forming step, or the wavelength conversion member 40A may be divided by etching.

Figure 5D:
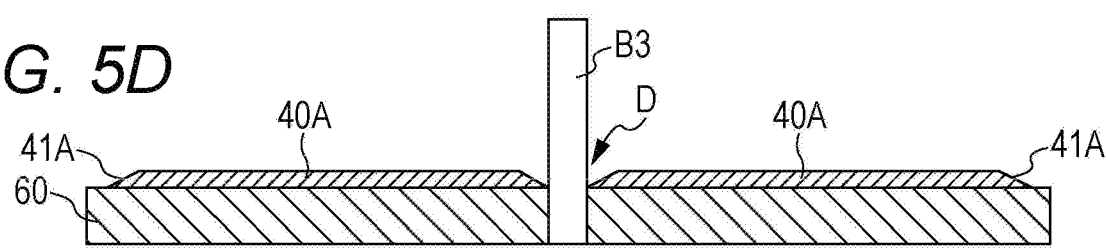
FIG. 5D is a sectional view schematically showing the method of manufacturing the light emitting device according to the second embodiment, with a division step.
Figure 5E:
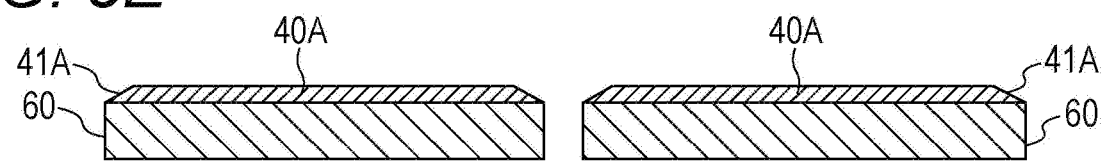
FIG. 5E is a sectional view schematically showing the method of manufacturing the light emitting device according to the second embodiment, with a light transmissive member divided through the division step.

In the division step, as shown in FIGS. 5D and 5E, a blade B3 having a predetermined width is used to dice and perpendicularly divide the light transmissive member 60 so as to pass through a center of the groove part D formed in the groove part forming step. Moreover, in the division step, the light transmissive member 60 is divided in such a manner that the light transmissive member 60 covers the upper surface of the light emitting element 20 in a plan view and the lower surface of the light transmissive member 60 has a larger area than the upper surface of the light emitting element 20. Then, the light emitting device 1A as shown in FIG. 4A is manufactured through the light emitting element mounting step (FIG. 3A), the wavelength conversion member joining step (FIG. 3B), and the light reflective member arrangement step (FIG. 3C).

In FIG. 5D, as one example of the division step, the blade B3 is used, but instead of the blade B3, laser light may be used to divide the light transmissive member 60 in the division step.

Third Embodiment

Figure 6A:
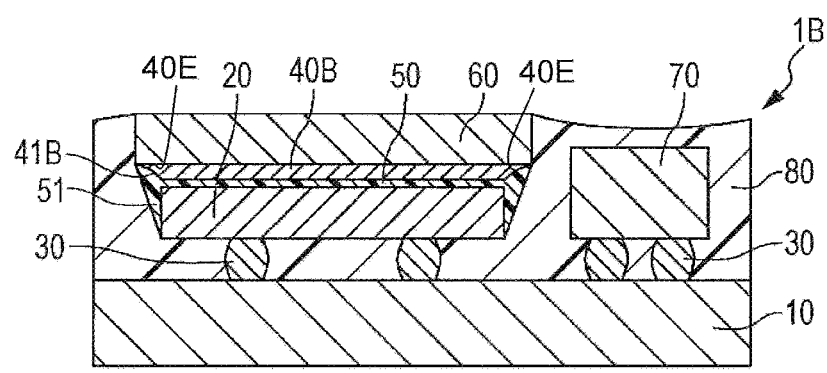
FIG. 6A is a sectional view schematically showing a configuration of a light emitting device according to a third embodiment.

A configuration of a light emitting device 1B according to the third embodiment will be described with reference to FIGS. 6A and 6B. As shown in FIG. 6A, the light emitting device 1B has the same configuration as the light emitting device 1 except for a configuration of a wavelength conversion member 40B (see FIG. 1B).

Figure 6B:
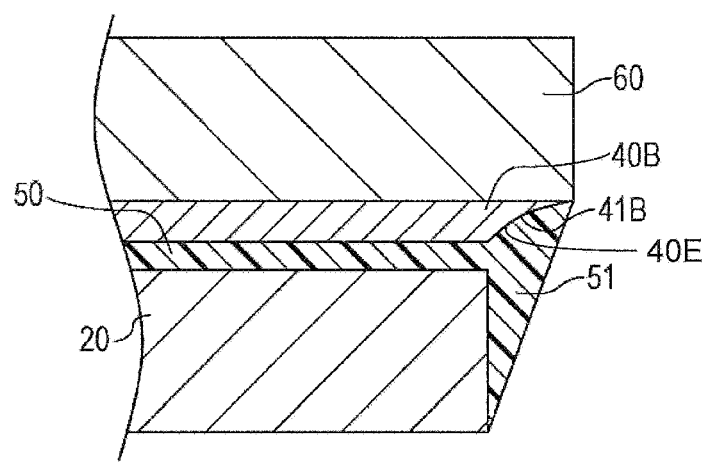
FIG. 6B is a sectional view schematically showing the configuration of the light emitting device according to the third embodiment on a partially enlarged scale of FIG. 6A.

As shown in FIG. 6B, the wavelength conversion member 40B of the light emitting device 1B has an upper surface formed to have the same size of area as that of the lower surface of the light transmissive member 60. Moreover, the wavelength conversion member 40B has an end part, that is, a region located on an outer side of the light emitting element 20 in a planar view, which is formed more thinly than other regions. The wavelength conversion member 40B is formed in such a manner that the region located on the outer side of the light emitting element 20 becomes thinner towards outer circumference while being curved.

More specifically, the wavelength conversion member 40B has a constant thickness in the region immediately above the light emitting element 20, and a side surface 41B of the wavelength conversion member 40B is formed in such a manner to be curved and inclined towards outer circumference in the region located on the outer side of the light emitting element 20, that is, the region between the side surface of the light emitting element 20 and the side surface of the light transmissive member 60. The region in which the wavelength conversion member 40B is formed into a curve, that is, the region between the side surface of the light emitting element 20 and the side surface of the light transmissive member 60 specifically has a width of 15 μm to 50 μm, if the light emitting element 20 has a size of a 1-mm square, for example.

Here, to manufacture the light emitting device 1B provided with the wavelength conversion member 40B as described above, in a groove part forming step, a condition of the laser light L1 may be adjusted, a groove part D may be formed in such a manner that the region of the wavelength conversion member 40B located on the outer side of the light emitting element 20 in a plan view becomes thinner towards the groove part D while being curved, and the side surface 41B of the wavelength conversion member 40B may be machined into a curve. The steps for manufacturing the light emitting device 1B are the same as those of the light emitting device 1A described above except for the groove part forming step.

In the light emitting device 1B having the configuration described above, the shape of the end part of the wavelength conversion member 40B can be machined into a curve towards outer circumference to thereby enable a yellow component of the end part of a light emitting surface to be adjusted more finely, similarly to the light emitting device 1A, thus permitting more effective reduction in color unevenness on the light emitting surface.

The light emitting device and the method of manufacturing the light emitting device according to the embodiments have been described in detailed description of embodiments, but the spirits of the present invention are not limited to these descriptions, and should be widely interpreted from the description in the claims. Moreover, it is needless to say that various modifications, revisions, or the like, based on these descriptions are also included in the spirits of the present invention.

For example, the light emitting devices 1 to 1B may be provided with underfilling in a gap between the light emitting element 20 and the semiconductor element 70, and the conductive member 30 when needed. The underfilling is provided for protecting the light emitting element 20, the semiconductor element 70, the conductive member 30, or the like, disposed on the substrate 10 from dust, moisture, external force, or the like. As a material of the underfilling, for example, a silicone resin, an epoxy resin, or a urea resin can be used. Moreover, in addition to such materials, a coloring agent, a light diffusing member, a filler, a phosphor member, or the like, can be contained when necessary.

A light emitting device according to one aspect of the embodiment of the present invention includes: a light emitting element; a wavelength conversion member having a surface which is larger than an upper surface of the light emitting element and is joined to the upper surface of the light emitting element; a light transmissive member having a larger area than the upper surface of the light emitting element and disposed on an upper surface of the wavelength conversion member; a side light guide member with light transmissive property formed from a side surface of the light emitting element to a lower edge surface of the wavelength conversion member; and a light reflective member disposed at least each side surface of the wavelength conversion member, the light transmissive member, and the side light guide member, wherein the wavelength conversion member has the upper surface smaller than a lower surface of the light transmissive member, or a region located on an outer side of the light emitting element is formed more thinly than a region immediately above the light emitting element.

A method of manufacturing a light emitting device according to another aspect of the embodiment of the present invention includes the steps of: preparing a light transmissive member having a lower surface on which a wavelength conversion member is formed; forming a groove part at the wavelength conversion member; dividing the light transmissive member through the groove part; and joining the wavelength conversion member formed on the lower surface of the light transmissive member to an upper surface of a light emitting element with a bonding member in between, wherein the step of forming the groove part forms the groove part in such a manner that an upper surface of the wavelength conversion member has a larger area than the upper surface of the light emitting element, and forms the groove part in such a manner that the upper surface of the wavelength conversion member has a smaller area than the lower surface of the light transmissive member or that a region located on an outer side of the light emitting element is thinner than a region immediately above the light emitting element, and the step of joining the wavelength conversion member forms a side light guide member by extending a bonding member which is provided between the light emitting element and the wavelength conversion member from a side surface of the light emitting element to a lower edge surface of the wavelength conversion member.

With the light emitting device according to the embodiments of the present invention, light emitted from the side surface of the light emitting element can be extracted to the front by use of the side light guide member, and also a yellow light component of an end part of a light emitting surface can be reduced by reducing a surface on which the wavelength conversion member makes contact with the light transmissive member or by machining a shape of the end part of the wavelength conversion member. Therefore, with the light emitting device, the front luminance can be improved, and also occurrence of color unevenness at an outer circumferential part of the light emitting surface can be reduced.

With the method of manufacturing a light emitting device according to the embodiments of the present invention, the bonding member is extended from the side surface of the light emitting element to the lower edge surface of the wavelength conversion member to thereby form a side light guide member for extracting light emitted from the side surface of the light emitting element to the front, to reduce the surface on which the wavelength conversion member makes contact with the light transmissive member, or to machine a shape of the end part of the wavelength conversion member. Therefore, the method of manufacturing the light emitting device permits manufacture of a light emitting device capable of improving the front luminance and also reducing occurrence of color unevenness at the outer circumferential part of the light emitting surface.

Obviously, numerous modifications and variations of the present invention are possible in light of the above teachings. It is therefore to be understood that within the scope of the appended claims, the invention may be practiced otherwise than as specifically described herein.

What is claimed is:

1. A method of manufacturing a light emitting device, the method comprising:
providing a light emitting element having an element upper surface, an element lower surface opposite to the element upper surface in a thickness direction of the light emitting element, and an element side surface between the element upper surface and the element lower surface;
providing a wavelength conversion member on a light transmitting member, forming a groove in the wavelength conversion member, and dividing the light transmitting member at the groove so that the light transmitting member divided constitutes a light transmitting layer, the wavelength conversion member having a converter lower surface; and
joining the wavelength conversion member and the light transmitting layer to the light emitting element using an adhesive so that the converter lower surface faces the element upper surface, the converter lower surface having an exposed region that does not face the element upper surface viewed along the thickness direction, the adhesive covering the element side surface and the exposed region.

2. The method according to claim 1,
wherein the wavelength conversion member has a converter upper surface opposite to the converter lower surface in the thickness direction,
wherein the light transmitting layer has a layer lower surface facing the converter upper surface, and
wherein the converter upper surface is smaller than the layer lower surface.

3. The method according to claim 1, wherein the groove has a tapered shape.

4. The method according to claim 1, wherein the groove has a curved shape.

5. The method according to claim 1,
wherein the wavelength conversion member is joined to the light emitting element by disposing the wavelength conversion member provided on the light transmitting layer to the light emitting element via the adhesive and applying pressure to the light transmitting layer so that the adhesive covers the element side surface and the exposed region.

6. The method according to claim 1, further comprising:
providing another light emitting element on a substrate on which the light emitting element is provided.

7. The method according to claim 2, further comprising:
providing a reflector on a converter side surface connecting the converter lower surface and the converter upper surface.

8. The method according to claim 7, wherein the reflector is provided on the converter side surface via the adhesive.

9. The method according to claim 7,
wherein the adhesive has an adhesive inner side surface facing the element side surface and an adhesive outer side surface opposite to the adhesive inner side surface in a side direction perpendicular to the thickness direction, and
wherein the reflector is provided on the adhesive outer side surface.

10. The method according to claim 7,
wherein the light transmitting layer has a layer upper surface opposite to the layer lower surface in the thickness direction and a layer side surface connecting the layer upper surface and the layer lower surface, and
wherein the reflector is provided on the layer side surface.

11. The method according to claim 1, wherein the adhesive is configured to guide light from the light emitting element towards the wavelength conversion member.

12. The method according to claim 1, wherein the adhesive includes a silicon resin.

13. The method according to claim 1, wherein the wavelength conversion member includes a silicon resin as a binder.

14. The method according to claim 1, wherein the wavelength conversion member has a thickness of 20 µm to 100 µm in the thickness direction.

* * * * *